United States Patent
Mears et al.

(10) Patent No.: US 10,170,603 B2
(45) Date of Patent: Jan. 1, 2019

(54) SEMICONDUCTOR DEVICE INCLUDING A RESONANT TUNNELING DIODE STRUCTURE WITH ELECTRON MEAN FREE PATH CONTROL LAYERS

(71) Applicant: ATOMERA INCORPORATED, Los Gatos, CA (US)

(72) Inventors: Robert J. Mears, Wellesley, MA (US); Hideki Takeuchi, Austin, TX (US); Marek Hytha, Brookline, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/670,266

(22) Filed: Aug. 7, 2017

(65) Prior Publication Data

US 2018/0040743 A1 Feb. 8, 2018

Related U.S. Application Data

(60) Provisional application No. 62/371,971, filed on Aug. 8, 2016.

(51) Int. Cl.
*H01L 29/66* (2006.01)
*H01L 29/737* (2006.01)
(Continued)

(52) U.S. Cl.
CPC ........ *H01L 29/7376* (2013.01); *H01L 27/092* (2013.01); *H01L 29/1054* (2013.01);
(Continued)

(58) Field of Classification Search
CPC ............. H01L 29/157; H01L 29/66007; H01L 29/6603; H01L 29/8618; H01L 29/882
See application file for complete search history.

(56) References Cited

U.S. PATENT DOCUMENTS 4,851,886 A * 7/1989 Lee .................. B82Y 10/00
257/17
4,937,204 A 6/1990 Ishibashi et al.
(Continued)

FOREIGN PATENT DOCUMENTS

GB 2347520 6/2000

OTHER PUBLICATIONS

U.S. Appl. No. 15/592,464, filed May 11, 2017.
(Continued)

*Primary Examiner* — Joseph Galvin, III
(74) *Attorney, Agent, or Firm* — Allen, Dyer, Doppelt + Gilchrist, P.A.

(57) ABSTRACT

A semiconductor device including at least one double-barrier resonant tunneling diode (DBRTD) is provided. The at least one DBRTD may include a first doped semiconductor layer, and a first barrier layer on the first doped semiconductor layer and including a superlattice. The DBRTD may further include a first intrinsic semiconductor layer on the first barrier layer, a second barrier layer on the first intrinsic semiconductor layer and also including the superlattice, a second intrinsic semiconductor layer on the second barrier layer, a third barrier layer on the second intrinsic semiconductor layer and also including the superlattice. A third intrinsic semiconductor layer may be on the third barrier layer, a fourth barrier layer may be on the third intrinsic semiconductor layer and also including the superlattice, a second doped semiconductor layer on the fourth barrier layer.

20 Claims, 15 Drawing Sheets

(51) Int. Cl.
*H01L 27/092* (2006.01)
*H01L 29/10* (2006.01)
*H01L 29/15* (2006.01)
*H01L 29/161* (2006.01)
*H01L 29/78* (2006.01)
*H01L 29/36* (2006.01)
*H01L 29/861* (2006.01)
*H01L 29/88* (2006.01)

(52) U.S. Cl.
CPC .......... *H01L 29/152* (2013.01); *H01L 29/155* (2013.01); *H01L 29/157* (2013.01); *H01L 29/161* (2013.01); *H01L 29/36* (2013.01); *H01L 29/6603* (2013.01); *H01L 29/66007* (2013.01); *H01L 29/66121* (2013.01); *H01L 29/66151* (2013.01); *H01L 29/66477* (2013.01); *H01L 29/66545* (2013.01); *H01L 29/66651* (2013.01); *H01L 29/78* (2013.01); *H01L 29/7842* (2013.01); *H01L 29/8618* (2013.01); *H01L 29/882* (2013.01)

(56) References Cited

U.S. PATENT DOCUMENTS

| | | | |
|---|---|---|---|
| 5,216,262 A | 6/1993 | Tsu | |
| 5,357,119 A | 10/1994 | Wang et al. | |
| 5,606,177 A | 2/1997 | Wallace et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 2002/0175273 A1 | 11/2002 | Moddell et al. | |
| 2003/0034529 A1 | 2/2003 | Fitzgerald et al. | |
| 2003/0049894 A1* | 3/2003 | Berger ................ | B82Y 10/00 438/183 |
| 2003/0057416 A1 | 3/2003 | Currie et al. | |
| 2006/0220118 A1 | 10/2006 | Stephenson et al. | |
| 2007/0012910 A1 | 1/2007 | Mears et al. | |
| 2007/0020833 A1 | 1/2007 | Mears et al. | |
| 2007/0197006 A1* | 8/2007 | Dukovski .......... | H01L 21/0237 438/483 |
| 2008/0012004 A1 | 1/2008 | Huang et al. | |
| 2008/0073641 A1* | 3/2008 | Cheng .................. | B82Y 10/00 257/25 |
| 2008/0258134 A1 | 10/2008 | Mears et al. | |
| 2011/0215299 A1 | 9/2011 | Rao | |
| 2012/0119838 A1* | 5/2012 | Koyama ............... | H03B 7/08 331/115 |
| 2013/0247951 A1* | 9/2013 | McCann ............... | H01L 35/26 136/238 |
| 2015/0357414 A1 | 12/2015 | Mears | |
| 2016/0099317 A1 | 4/2016 | Mears et al. | |
| 2016/0149023 A1 | 5/2016 | Mears et al. | |
| 2016/0336406 A1 | 11/2016 | Mears et al. | |
| 2016/0336407 A1 | 11/2016 | Mears et al. | |
| 2016/0358773 A1 | 12/2016 | Mears et al. | |
| 2017/0294514 A1 | 10/2017 | Mears | |

OTHER PUBLICATIONS

U.S. Appl. No. 15/633,918, filed Jun. 27, 2017.
U.S. Appl. No. 15/664,028, filed Jul. 31, 2017.
U.S. Appl. No. 15/670,231, filed Aug. 7, 2017.
U.S. Appl. No. 15/670,240, filed Aug. 7, 2017.
U.S. Appl. No. 15/670,274, filed Aug. 7, 2017.
U.S. Appl. No. 15/678,616, filed Aug. 16, 2017.
U.S. Appl. No. 15/678,658, filed Aug. 16, 2017.
Ashok K. Sharma "Advanced Semiconductor Memories: Architectures, Designs, and Applications" Wiley-IEEE Press; 1 edition (Oct. 14, 2002); pp. 672; Abstract Only.
Chen et al. "Negative Differential Resistance Circuit Design and Memory Applications" IEEE Transactions on Electron Devices, vol. 56, No. 4, Apr. 2009: pp. 634-640.
J.P.A. van der Wagt "Tunneling-based SRAM" Proceedings of the IEEE (vol. 87, Issue: 4, Apr. 1999) pp. 571-595: Abstract Only.
Jasprit Singh "Quantum Mechanics: Fundamentals and Applications to Technology" WILEY-VCH Verlag GmbH & Co. KGaA; Dec. 29, 2007; Abstract Only.
Liang et al. "From DRAM to SRAM with a Novel SiGe-based Negative Differential Resistance (NDR) Device" IEEE: 2005; pp. 4.
Luo et al., "Chemical Design of Direct-Gap Light-Emitting Silicon" published in Physical Review Letters, vol. 89, No, 7; Aug. 12, 2002; 4 pgs.
Maezawa et al. "Functions and Applications of Monostable-Bistable Transition Logic Elements (MOBILE™s) Having Multiple-Input Terminals" IEEE Transactions on Electron Devices, vol. 41, No. 2, Feb. 1994: pp. 148-154.
Mazumder et al. Digital circuit applications of resonant tunneling devices' Proceedings of the IEEE: vol. 86 Issue: 4 Abstract Only.
Mears et al. "Simultaneous Carrier Transport Enhancement and variability reduction in Si MOSFETs by insertion of partial Monolay-

(56) References Cited

OTHER PUBLICATIONS ers of oxygen" IEEE silicon Nanoelectronics Workshop (2012): (Date of conference Jun. 10-11, 2012) pp. 2.

Novikov et al. "Silicon-based Optoelectronics" 1999-2003, pp. 1-6.

Pacha et al. "Threshold Logic Circuit Design of Parallel Adders Using Resonant Tunneling Devices" IEEE Transactions on Very Large Scale Integration (VLSI) Systems, vol. 8, No. 5, Oct. 2000: pp. 558-572.

Qui et al. "First-principles simulation of electron mean-free-path spectra and thermoelectric properties in silicon" EPL (Europhysics Letters), vol. 109, No. 5. pp. 6.

R. Tsu Phenomena in silicon nanostructure device published online Sep. 6, 2000 by Applied Physics and Materials Science & Processing, pp. 391-402.

Raphael Tsu "Si Based Green ELD: Si-Oxygen Superfattice" wysiwyg://i/http://www3.interscience.wiley.com/cgi-bin/abstract/72512946/ start: published online Jul. 21, 2000; 2 pgs. Abstract Only.

Tsai et al. "P-N double quantum well resonant interband tunneling diode with peak-to-valley current ratio of 144 at room temperature" IEEE Electron Device Letters ( vol. 15, Issue: 9, Sep. 1994) pp. 357-359. Abstract Only.

Tsu et al. "Silicon-based quantum wells" Nature; vol. 364; Jul. 1, 1993; p. 19.

Uemura et al. "Design and analysis of resonant-tunneling-diode (RTD) based high performance memory system" IEICE Transactions on Electronics; issue 9; 1999; pp. 1630-1636. Abstract Only.

Watanabe et al "CaF2/CdF2 Double-barrier resonant tunneling diode with high room-temperature peak-to-valley ratio" Japanes Journal of Applied Physics: vol. 39, part2 No. 7b; 2000; Abstract Only.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al., "MOSFET performance and scalability enhancement by insertion of oxygen layers", Department of Electrical Engineering and Computer Science, University of California, Berkeley, 2012, pp. 1-4.

Yu et al. "Fundamentals of Semiconductors Physics and Materials Properties" Springer-Verlag Berlin Heidelberg; 2010; pp. 778; Abstract Only.

Paulus et al., "Parametric study of AIAs/GaAs superlattice double-barrier diodes", Applied Physics Letters, vol. 53, No. 3, Jul. 1988, pp. 207-209.

\* cited by examiner

SEMICONDUCTOR DEVICE INCLUDING A RESONANT TUNNELING DIODE STRUCTURE WITH ELECTRON MEAN FREE PATH CONTROL LAYERS

CROSS-REFERENCE TO RELATED APPLICATIONS

This application claims the benefit of U.S. Provisional App. No. 62/371,971 filed Aug. 8, 2016, which is hereby incorporated herein in its entirety by reference.

TECHNICAL FIELD

The present disclosure generally relates to semiconductor devices and, more particularly, to semiconductor diode structures and related circuits and methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2/Si$ with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A semiconductor device including at least one double-barrier resonant tunneling diode (DBRTD) is provided. The at least one DBRTD may include a first doped semiconductor layer, and a first barrier layer on the first doped semiconductor layer and comprising a superlattice. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The DBRTD may further include a first intrinsic semiconductor layer on the first barrier layer, a second barrier layer on the first intrinsic semiconductor layer and also comprising the superlattice, a second intrinsic semiconductor layer on the second barrier layer, a third barrier layer on the second intrinsic semiconductor layer and also comprising the superlattice, a third intrinsic semiconductor layer on the third barrier layer, a fourth barrier layer on the third intrinsic semiconductor layer, and a second doped semiconductor layer on the fourth barrier layer.

More particularly, the first and second doped semiconductor layers may comprise silicon, and the second intrinsic layer may comprise at least one of silicon and germanium in one example embodiment. Further, the second doped semiconductor layer may comprise a single crystal semiconductor layer.

In accordance with one example embodiment, the first and second doped semiconductor layers may have the same dopant conductivity type. In accordance with another example, the first and second doped semiconductor layers may have opposite dopant conductivity types.

Furthermore, the first barrier layer and the first intrinsic semiconductor layer may define a first electron mean free path control layer; and the third intrinsic semiconductor layer and the fourth barrier layer may define a second electron mean free path control layer. By way of example, the at least one non-semiconductor monolayer may comprise oxygen, and the semiconductor monolayers may comprise silicon.

DETAILED DESCRIPTION

Figure 1:
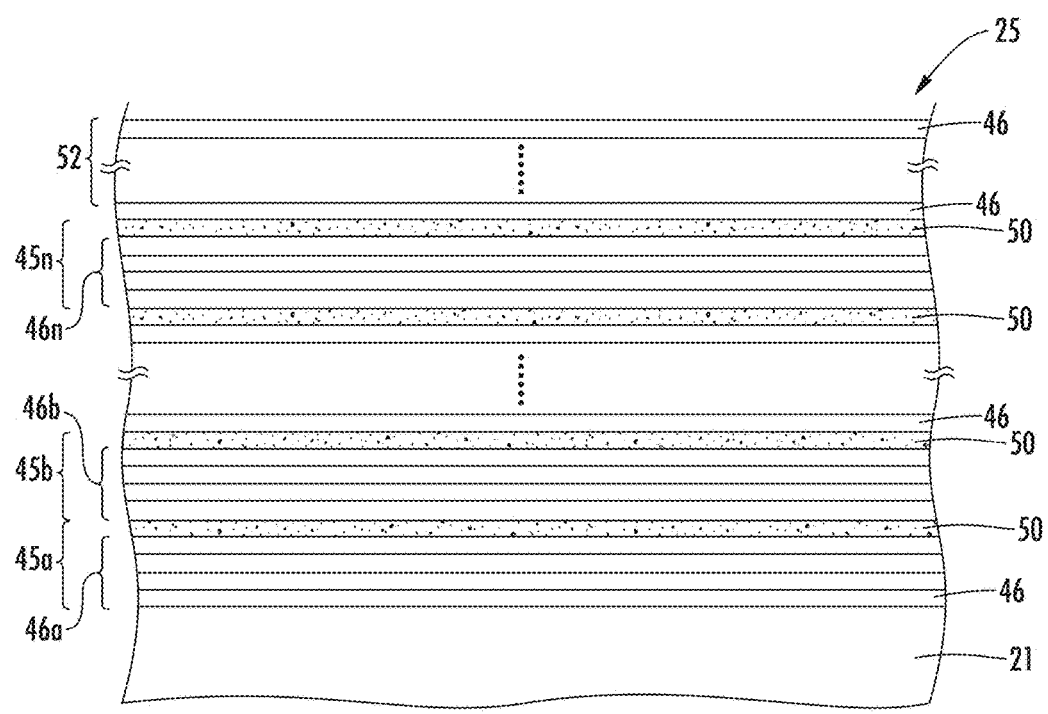
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to tunneling diode devices, including RTD devices, having an enhanced semiconductor superlattice therein which may provide desired potential barrier and dopant confinement features and enabling integration of such devices in standard CMOS processes. The enhanced semiconductor superlattice is also referred to as an "MST" layer or "MST technology" in this disclosure and the accompanying Appendix A. Further background on the use of MST technology to provide dopant blocking features in semiconductor devices may be found in U.S. Pat. No. 9,275,996 to Mears et al., which his hereby incorporated herein in its entirety by reference.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) =$$
$$\frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
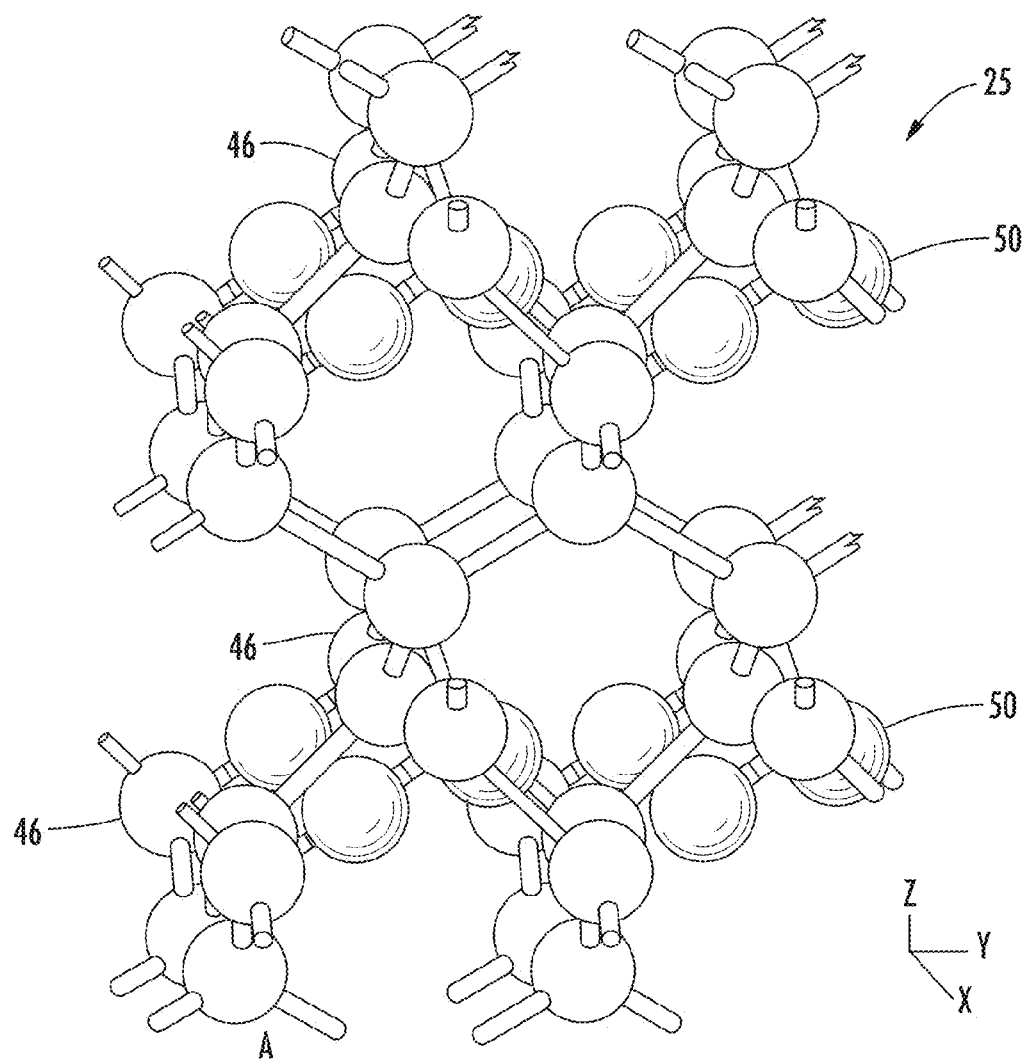
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
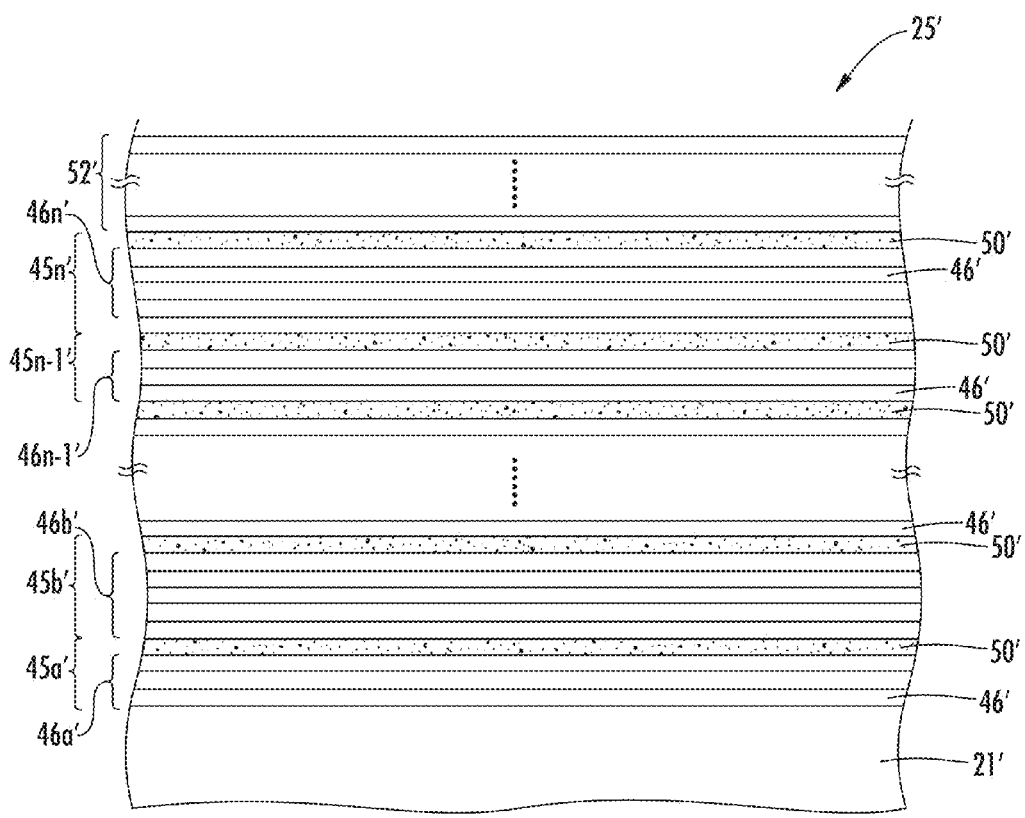
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
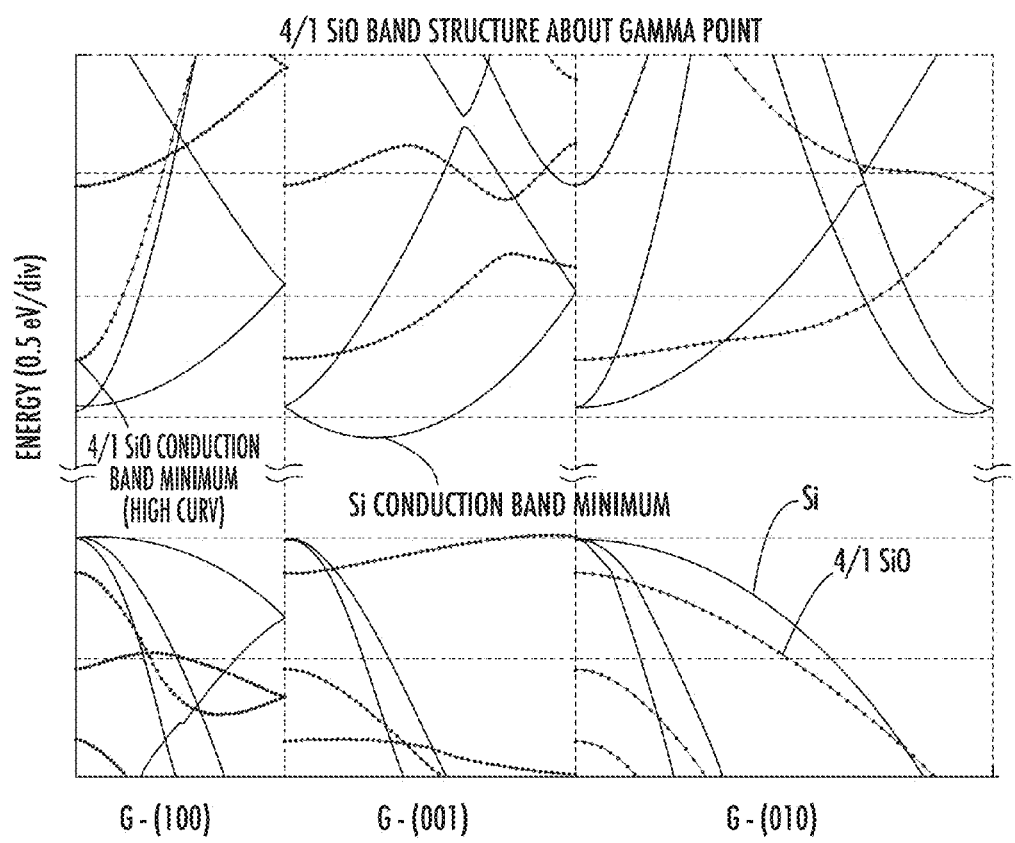
FIG. 4A is a graph of the calculated band structure from the gamma point (G) for both bulk silicon as in the prior art, and for the 4/1 Si/O superlattice as shown in FIGS. 1-2.
Figure 4B:
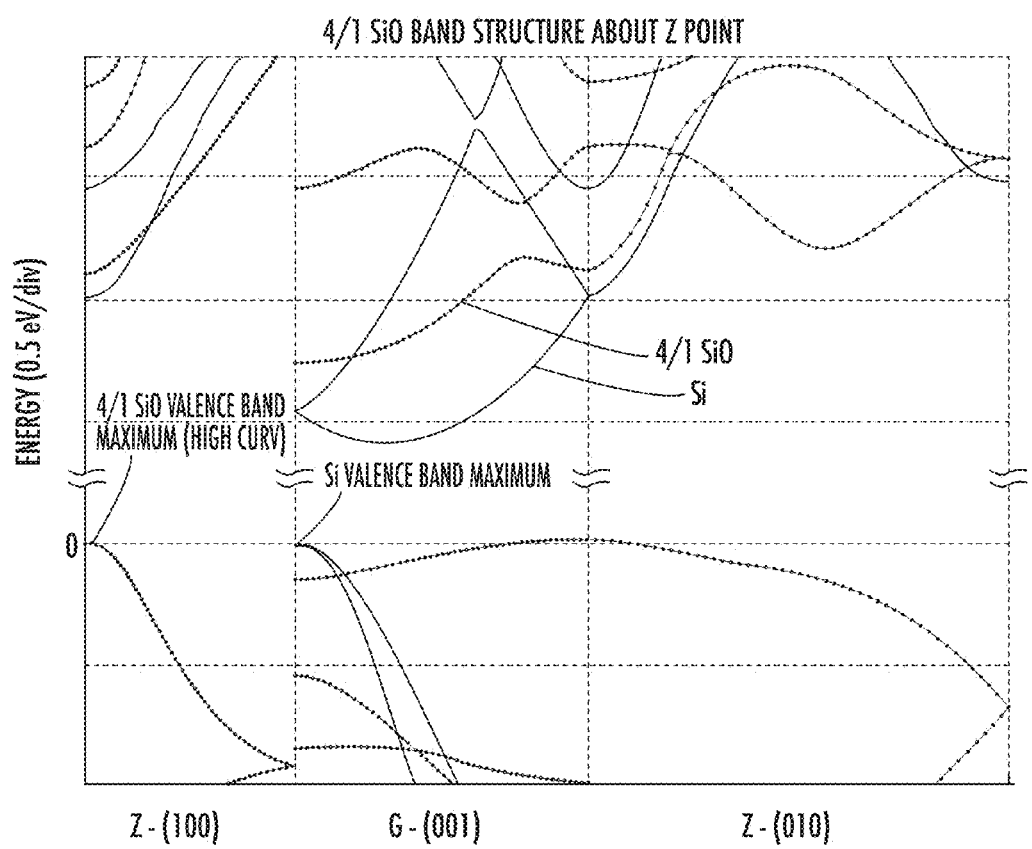
FIG. 4B is a graph of the calculated band structure from the Z point for both bulk silicon as in the prior art, and for the 4/1 Si/O superlattice as shown in FIGS. 1-2.
Figure 4C:
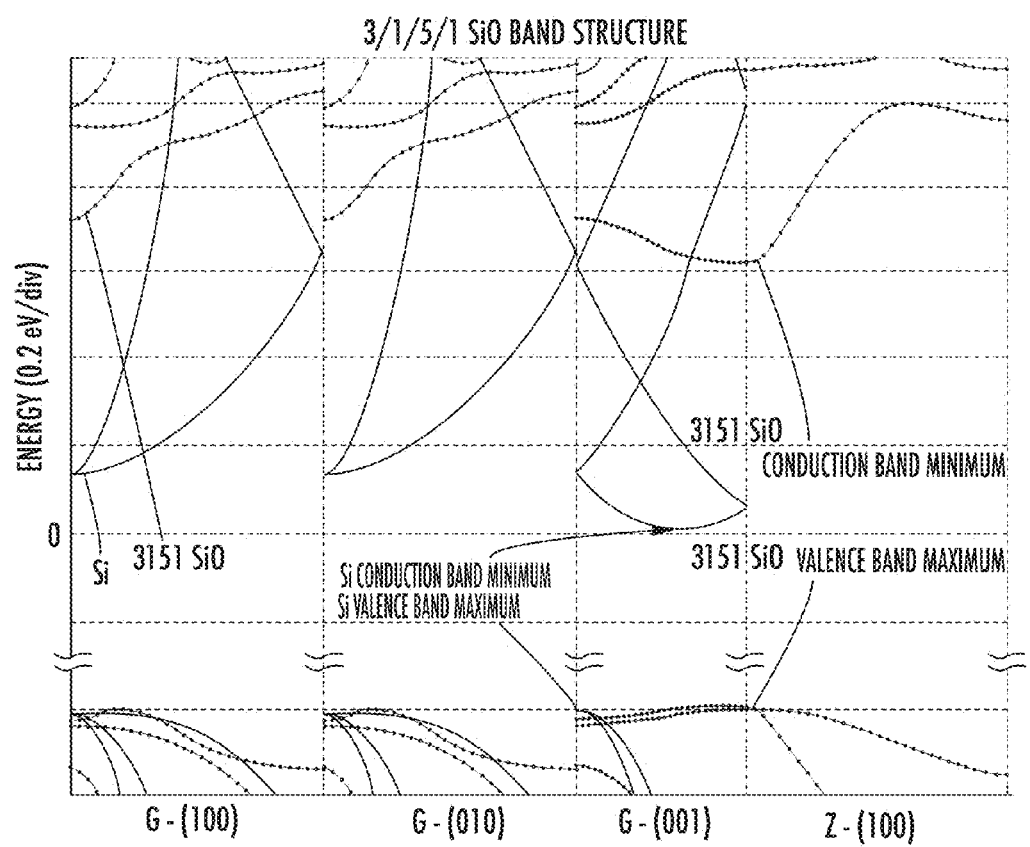
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Turning to FIGS. 5A-6B, tunneling diode structures and associated devices including the above-described superlattice technology (also referred to as "MST" herein) are now described. By way of background, resonant tunneling diodes operate in a similar fashion to p-n junction diodes, in that the diode will conduct an "on" current with forward bias. Yet, in p-n junction diodes the bias current monotonically increases the forward current, whereas a resonant tunneling diode (RTD) exhibits negative differential resistance (NDR), in which the current level drops with increased bias. NDR characteristics increase operation points on load lines, and it is thus attractive for various circuit applications.

Generally speaking, most RTD devices utilize III-V materials, which makes integration into Si-based CMOS platforms very difficult. Moreover, a high doping level is typically desired at the contact regions for ohmic contacts. For example, doping levels may be at least $10 \times 10^{18}/cm^3$, and levels of greater than $1 \times 10^{20}/cm^3$ may be desired for lower contact resistance.

On the other hand, RTDs also typically use a relatively low doping level in the three regions immediately adjacent to and between the double barriers to prevent impurity scattering. The requisite doping level is generally determined based upon the electron mean free path vs. the dimensions of the double barrier and tunneling layer thicknesses. Typically, the doping level may be set at approximately $1 \times 10^{16}/cm^3$.

Figure 6A:
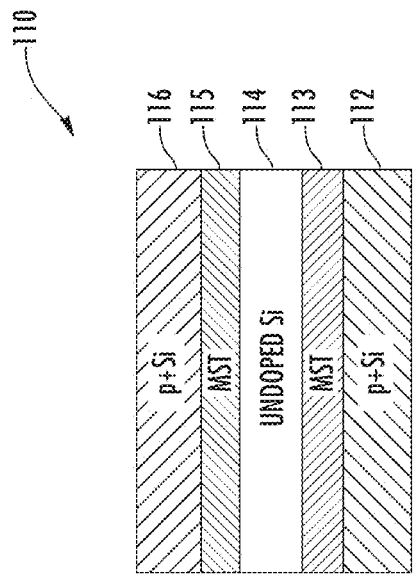
FIG. 6A is a schematic cross-sectional diagram of a P-type double barrier resonant tunneling diode (DBRTD) including superlattice barrier layers in accordance with an example embodiment.
Figure 6B:
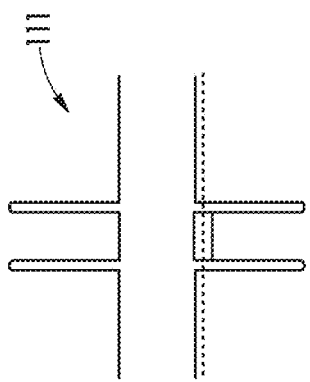
FIG. 6B is an energy band diagram for the DBRTD of FIG. 6A.
Figure 5A:
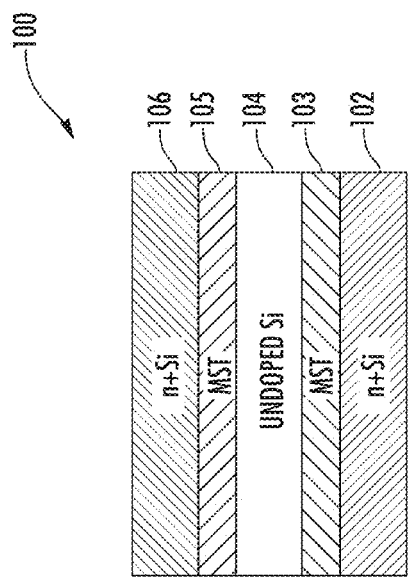
FIG. 5A is a schematic cross-sectional diagram of an N-type double barrier resonant tunneling diode (DBRTD) including superlattice barrier layers in accordance with an example embodiment.
Figure 5B:
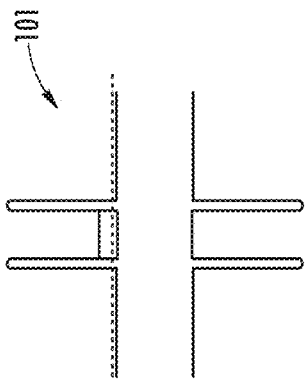
FIG. 5B is an energy band diagram for the DBRTD of FIG. 5A.

N-type and P-type MST double barrier (DB) RTD structures 110, 110 and their associated band diagrams 101, 102 are shown in FIGS. 5A, 6B and 5B, 6B, respectively. The N-type DBRTD structure 100 illustratively includes a stack of layers including (starting from the bottom) a bottom n+ Si contact layer 102, a first superlattice barrier layer 103 (such as the superlattice layers 25, 25' described above—labeled MST in the drawings), an undoped (intrinsic) Si layer 104, a second superlattice barrier layer 105, and an upper n+ Si contact layer 106. Similarly, the P-type DBRTD 110 illustratively includes a stack of layers including (starting from the bottom) a bottom p+ Si contact layer 112, a first superlattice barrier layer 113, an undoped (intrinsic) Si layer 114, a second superlattice barrier layer 115, and an upper p+ Si contact layer 116.

The superlattice barrier layers 103, 105 and 113, 115 advantageously allow for the formation of potential barriers in the Si conduction band (CB) and valence band (VB) while maintaining Si epitaxy when forming the upper contact layers 106, 116. That is, the above-described superlattice structure advantageously allows semiconductor (e.g., silicon) bonds to propagate through the intervening oxygen atoms so that the epitaxy is not disrupted, allowing single crystalline semiconductor contact layers to be formed on top of the second superlattice barrier layers 105, 115.

The barrier height may advantageously be tuned for the given RTD application using the different structures and fabrication techniques described above. Simulations of a 4/1 repeating structure with a 15 Å spacing between non-semiconductor (e.g., oxygen) monolayers projects approximately 0.6 eV for both the CB and VB. Furthermore, the potential barrier strength resulting from the MST barrier layers may be tuned based upon the oxygen concentration per monolayer, spacing between oxygen monolayers, and the number of oxygen monolayers used, for example, as will be appreciated by those skilled in the art.

However, another important characteristic of the superlattice film is that it may advantageously be used to block dopant diffusion from the highly doped contact layers 102, 106 and 112, 116 into the undoped/intrinsic layers 104, 114, as discussed further above. That is, the superlattice material advantageously allows the desired doping profiles to be created for an RTD structure, with a high concentration of doping near the contacts and little or no doping in RTD regions, with relatively precise process control. Moreover, the superlattice material also provides for strain buffer capability for hetero epitaxial film growth, as well as a strain buffer effect for lattice mismatch of hetero epitaxial films.

Referring additionally to FIGS. 7A-8B, other examples of N-type and P-type DBRTD structures 120, 130 are shown along with their respective band diagrams 121, 131. In contrast to the DBRTD structures 100, 110 described above, the DBRTD structures 120, 130 illustratively include upper $SiO_2$ barrier layers 125, 135 instead of upper superlattice barrier layers. More particularly, the N-type DBRTD 120 illustratively includes (starting from the bottom of the stack) a bottom n+ Si contact layer 122, a superlattice barrier layer 123, an undoped (intrinsic) Si layer 124, the $SiO_2$ upper barrier layer 125, and an upper n+ polysilicon contact layer 126. Similarly, the P-type DBRTD 130 illustratively includes (starting from the bottom of the stack) a bottom p+ Si contact layer 132, an superlattice barrier layer 133, an undoped (intrinsic) Si layer 134, an $SiO_2$ barrier layer 135, and an upper p+ polysilicon contact layer 136. The $SiO_2$ layers 125, 135 may be formed in a similar fashion to the way in which oxygen monolayers are formed during the MST monolayer deposition, but with a longer exposure time and/or higher dosage so that more Si bonding sites are populated with O atoms to form $SiO_2$. In these examples, the upper n+ and p+ Si contact layers 126, 136 are polysilicon because they are formed on $SiO_2$, as opposed to the single crystal Si layers 106, 116 which may be epitaxially grown on the superlattice layers 105, 115, as described above.

Figure 8A:
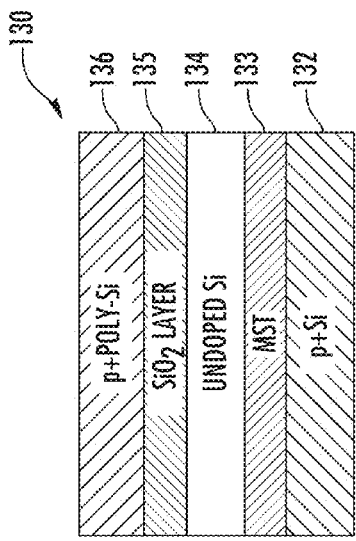
FIG. 8A is a schematic cross-sectional diagram of a P-type DBRTD including superlattice and $SiO_2$ barrier layers in accordance with an example embodiment.
Figure 8B:
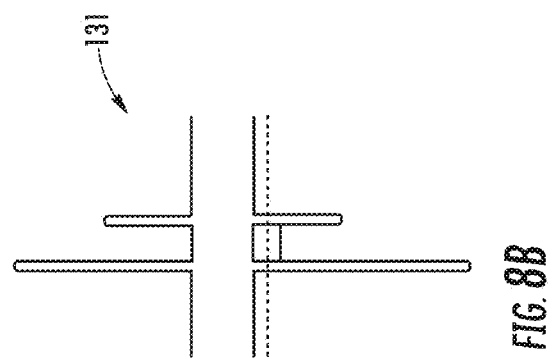
FIG. 8B is an energy band diagram for the DBRTD of FIG. 8A.

Turning to FIGS. 9A-10B, example P-type DBRTD structures 140, 150 are now described which are respectively similar to the P-type structures 110 and 130 shown in FIGS. 6A and 8A, with the exception of a Ge tunneling layer 144, 154 in place of the undoped (intrinsic) Si layers 114, 134 in the previous embodiments. Integration of thin Ge film into Si advantageously allows for a VB offset for appropriate applications. In some embodiments, silicon germanium (e.g., a $Si_{1-x}Ge_x$ layer, where x=0~1.0) may also be used for the layers 144, 154.

The P-type DBRTD 140 illustratively includes (starting from the bottom of the stack) a bottom p+ Si contact layer 142, a first superlattice barrier layer 143, an undoped (intrinsic) Ge tunneling layer 144, a second superlattice barrier layer 145, and an upper p+ Si contact layer 146. In the second example, the P-type DBRTD 150 illustratively includes (starting from the bottom of the stack) a bottom p+ Si contact layer 152, a superlattice barrier layer 153, an undoped (intrinsic) Ge layer 154, an $SiO_2$ layer 155, and an upper p+ polysilicon Si contact layer 156. These same structures may instead be formed with n+ contact layers as well, as will be appreciated by those skilled in the art.

Figure 7A:
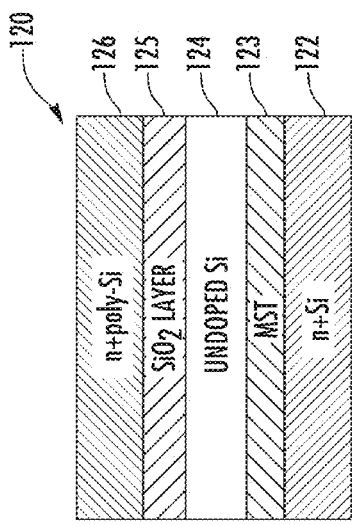
FIG. 7A is a schematic cross-sectional diagram of an N-type DBRTD including superlattice and $SiO_2$ barrier layers in accordance with an example embodiment.
Figure 7B:
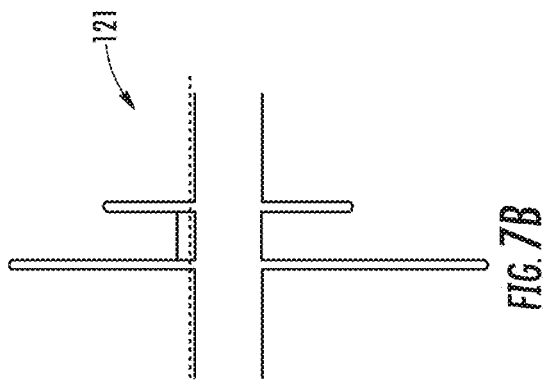
FIG. 7B is an energy band diagram for the DBRTD of FIG. 7A.
Figures 9A, 9B, 10A, 10B:
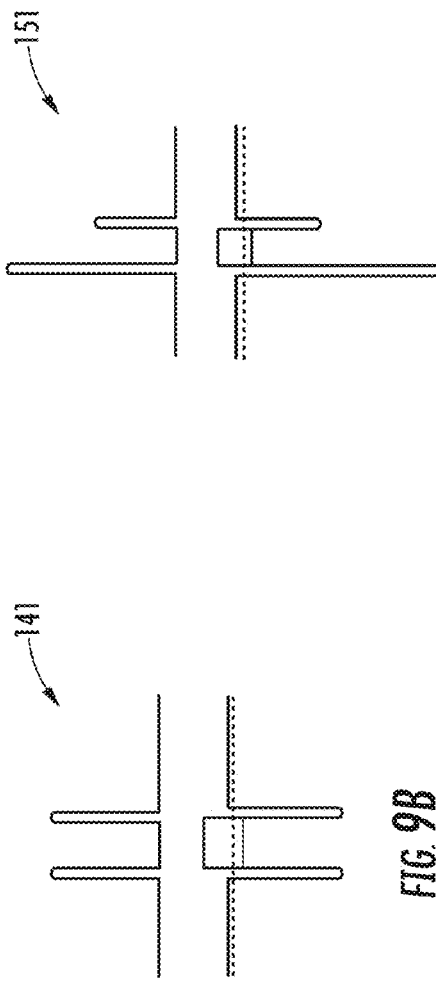
FIG. 9A is a schematic cross-sectional diagram of a P-type DBRTD including superlattice barrier layers and a germanium intrinsic layer in accordance with an example embodiment.
FIG. 9B is an energy band diagram for the DBRTD of FIG. 9A.
FIG. 10A is a schematic cross-sectional diagram of a P-type DBRTD including superlattice and $SiO_2$ barrier layers and a germanium intrinsic layer in accordance with an example embodiment.
FIG. 10B is an energy band diagram for the DBRTD of FIG. 10A.
Figure 12A:
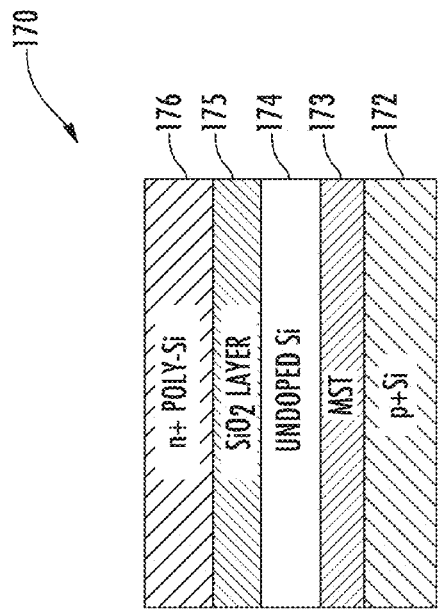
FIG. 12A is a schematic cross-sectional diagram of an inter-band DBRTD including superlattice and $SiO_2$ barrier layers and oppositely-doped contact layers in accordance with an example embodiment.
Figure 12B:
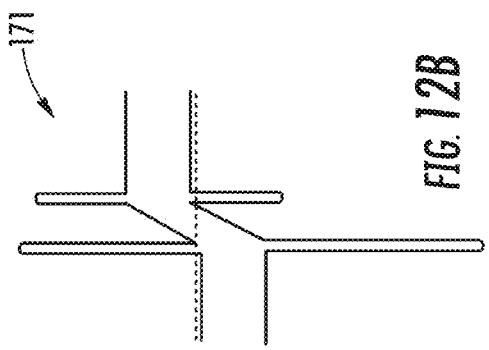
FIG. 12B is an energy band diagram for the DBRTD of FIG. 12A.
Figure 11A:
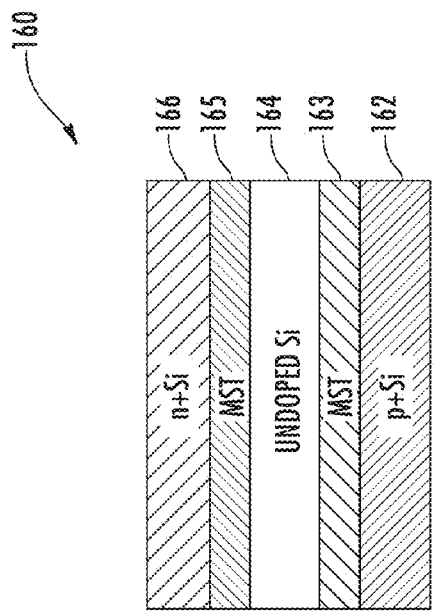
FIG. 11A is a schematic cross-sectional diagram of an inter-band DBRTD including superlattice barrier layers and oppositely-doped contact layers in accordance with an example embodiment.
Figure 11B:
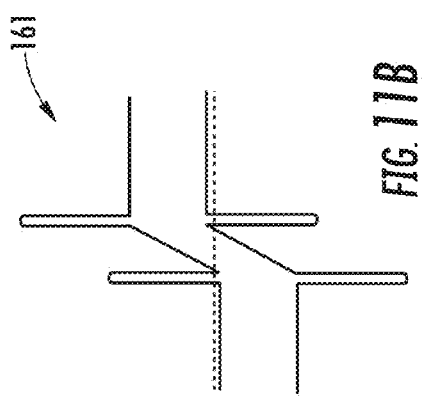
FIG. 11B is an energy band diagram for the DBRTD of FIG. 11A.
Figure 13A:
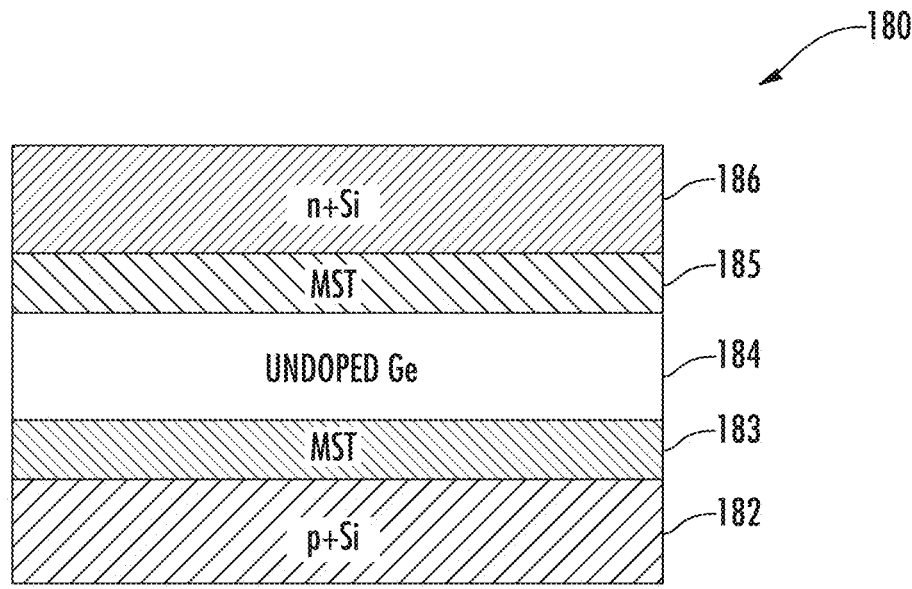
FIG. 13A is a schematic cross-sectional diagram of an inter-band DBRTD including superlattice barrier layers and oppositely-doped contact layers with an intrinsic germanium layer in accordance with an example embodiment.
Figure 13B:
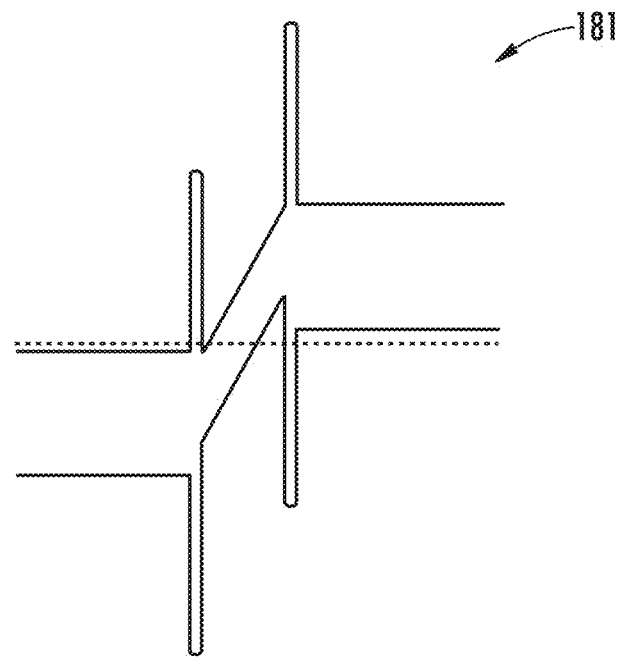
FIG. 13B is an energy band diagram for the DBRTD of FIG. 11A.

Turning now to FIGS. 11A-13B, three examples of resonant inter-band tunneling diodes (RITDs) 160, 170, 180 are shown along with their respective band diagrams 161, 171, 181, which respectively have layer structures similar to those shown in FIGS. 5A, 7A, and 9A, with the difference being that the upper and lower contact layers in the current examples are oppositely doped (i.e., doped with opposite conductivity type dopants). More particularly, in the first example the diode 160 illustratively includes (starting from the bottom of the stack) a bottom p+ Si contact layer 162, a first superlattice barrier layer 163, an undoped (intrinsic) Si layer 164, a second superlattice barrier layer 165, and an n+ Si upper contact layer 166. In the second example, the diode 170 illustratively includes (starting from the bottom of the stack) a bottom p+ Si contact layer 172, an superlattice barrier layer 173, an undoped (intrinsic) Si layer 174, a $SiO_2$ barrier layer 175, and an upper n+ polysilicon contact layer 176. The third example illustratively includes (starting from the bottom of the stack) a bottom p+ Si contact layer 182, a first superlattice barrier layer 183, an undoped (intrinsic) Ge layer 184, a second superlattice barrier layer 185, and an n+Si upper contact layer 186.

Figure 14:
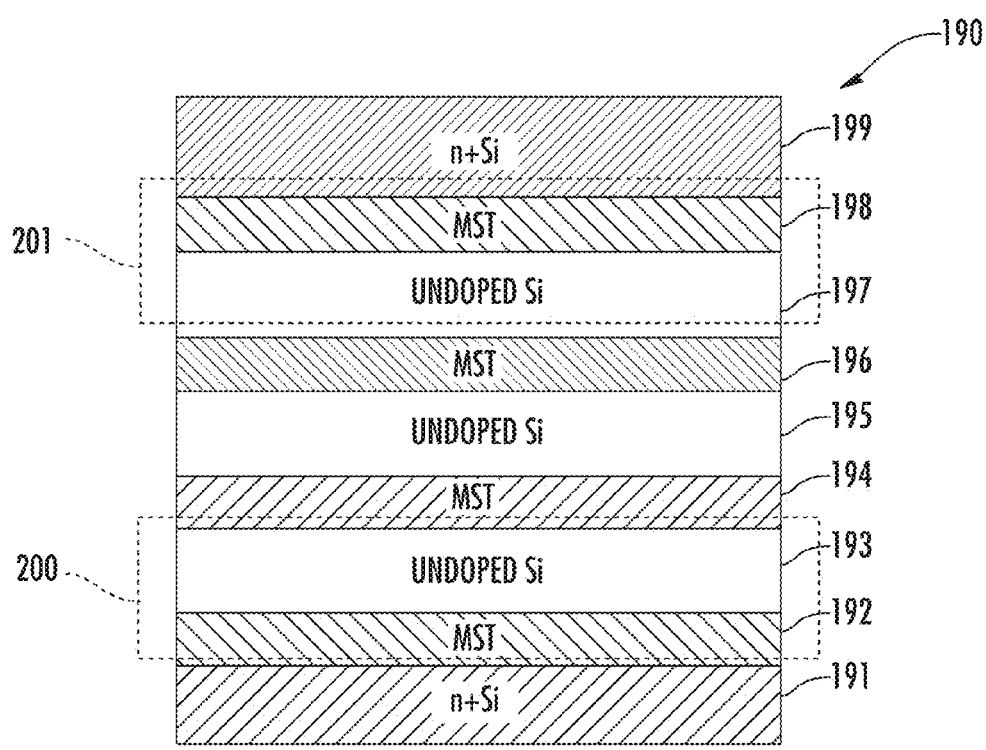
FIG. 14 is a schematic cross-sectional diagram of an N-type DBRTD including superlattice barrier layers and electron mean free path control layers in accordance with an example embodiment.
Figure 15:
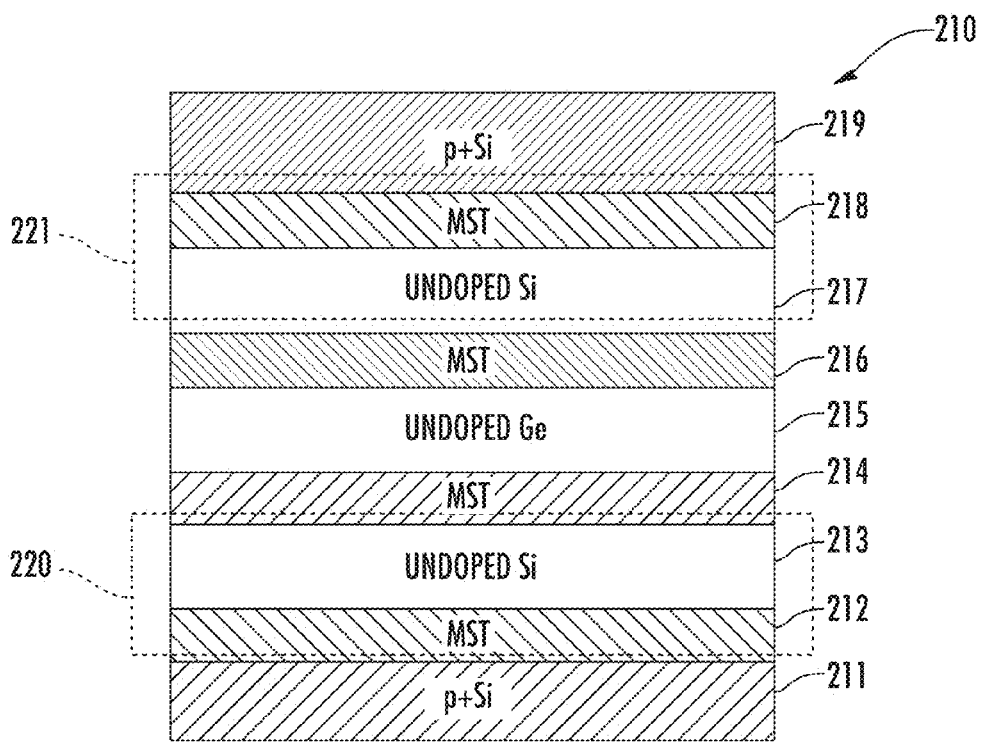
FIG. 15 is a schematic cross-sectional diagram of a P-type DBRTD including superlattice barrier layers, an intrinsic germanium layer, and electron mean free path control layers in accordance with an example embodiment.
Figure 16:
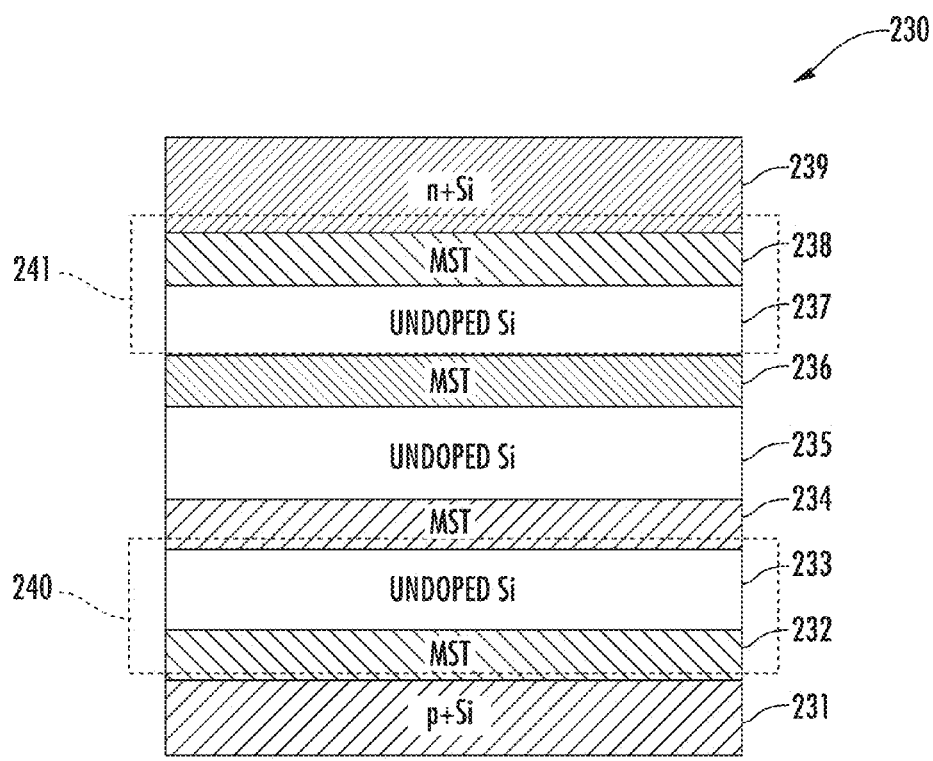
FIG. 16 is a schematic cross-sectional diagram of an inter-band DBRTD including superlattice barrier layers with oppositely doped contact layers and electron mean free path control layers in accordance with an example embodiment.

Turning now to FIGS. 14-16, three additional example RTD structures 190, 210, and 230 are provided which are respectively similar to the three examples shown in FIGS. 5A, 9A and 10A, but which further include additional electron mean free path control layers. More particularly, the first example is an N-type DBRTD illustratively including (starting at the bottom of the stack) an n+Si contact layer 191, a first superlattice layer 192, a first undoped Si layer 193, a second superlattice layer 194, a second undoped Si layer 195, a third superlattice layer 196, a third undoped Si layer 197, a fourth superlattice layer 198, and an upper n+Si contact layer 199 (note that this structure may have p+ contact layers as well in different embodiments). The superlattice layers 194, 196 serve as potential barrier layers, and the pairs of layers 192/193 and 197/198 respectively define electron mean free path control layers 200, 201.

The second example is a P-type DBRTD 210 illustratively including (starting from the bottom of the stack) a bottom p+ Si contact layer 211, a first superlattice layer 212, a first undoped Si layer 213, a second superlattice layer 214, an undoped Ge (or SiGe) layer 215, a third superlattice layer 216, a second undoped Si layer 217, a fourth superlattice layer 218, and an upper p+ contact layer 219 (note that this structure may have N-type contact layers in different embodiments). The superlattice layers 214, 216 serve as potential barrier layers, and the pairs of layers 212/213 and 217/218 respectively define electron mean free path control layers 220, 221.

The third example is an RITD 230 which illustratively includes (starting from the bottom of the stack) a p+ Si bottom contact layer 231, a first superlattice layer 232, a first undoped Si layer 233, a second superlattice layer 234, a second undoped Si layer 235, a third superlattice layer 236, a third undoped Si layer 237, a fourth superlattice layer 238, and an upper n+ Si contact layer 239 (note that the conductivities of the bottom and upper contact layers may be reversed in other embodiments). The superlattice layers 234, 236 serve as potential barrier layers, and the pairs of layers 232/233 and 237/238 respectively define electron mean free path control layers 240, 241.

Figure 17:
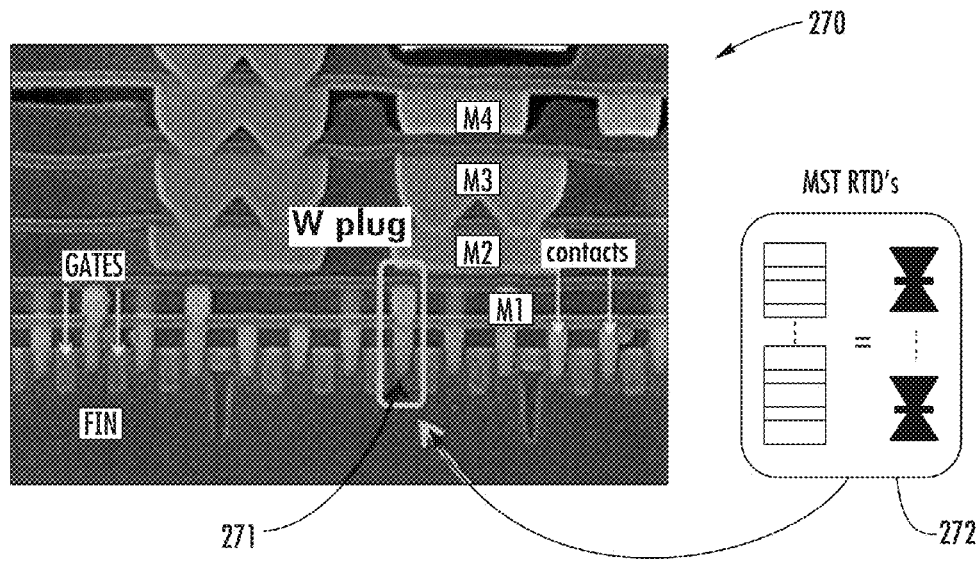
FIG. 17 is a cross-sectional diagram of a FINFET including one or more DBRTD devices in accordance with an example embodiment.

Turning now to FIG. 17, one example application for replacing at least a portion of a tungsten (W) plug 271 in a CMOS FINFET device 270 with one or more of RTD structures 272 such as those described above is shown. It should be noted that RTD structure(s) 272 may be used in planar semiconductor devices as well.

Figure 18:
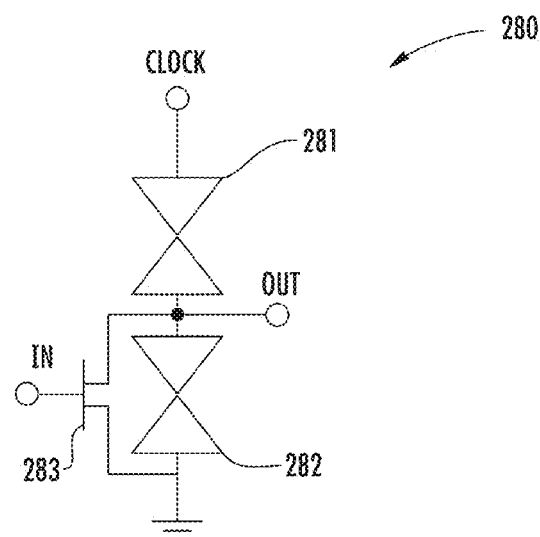
FIG. 18 is schematic circuit diagram of a monostable-bistable transition logic element (MOBILE) including a DBRTD in accordance with an example embodiment.

Referring to FIG. 18, in another example embodiment a MOBILE device illustratively includes a DBRTD 281 as described above and a second diode 282 (which may also be a DBRTD as described above in some embodiments) coupled in series between a clock signal Clock and ground. Furthermore, a transistor 283 has its source and drain coupled to the first and second contacts of the diode 282, and its gate coupled to an input signal IN. An output signal OUT is provided at the point where the diodes 281, 282 are coupled together.

Figure 19:
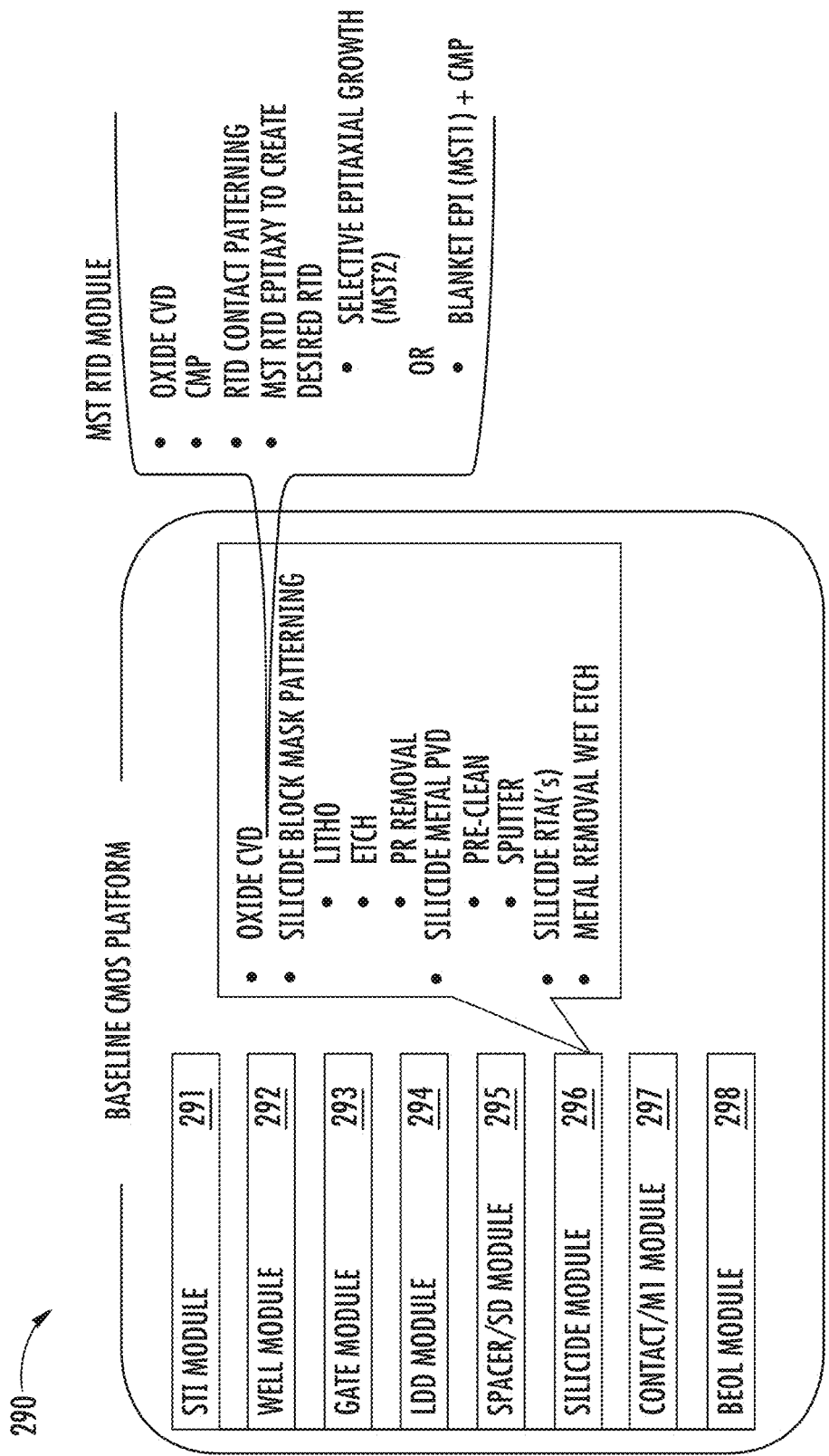
FIG. 19 is a flow diagram illustrating a process flow for making a semiconductor device including one or more DBRTD structures in accordance with an example embodiment.

An example CMOS process flow in which a superlattice RTD module may be included to form the above-described superlattice RTD structures within CMOS devices is shown in the flow diagram 290 of FIG. 19. The process begins with a shallow trench isolation (STI) module 291, followed by a well module 292, a gate module 293, a lightly doped drain (LDD) module 294, a spacer and source/drain module 295, a silicide module 296, a contact/M1 module 297, and a back end of line (BEOL) module 298. More particularly, in the illustrated example, the DBRTD formation occurs within the silicide module 296, in that after an oxide chemical vapor deposition (CVD), the MST RTD module is inserted, which includes another (optional) oxide CVD, chemical mechanical polishing (CMP), RTD contact patterning, and superlattice RTD epitaxy to create the desired RTD device (which may be done in either a blanket form across an entire wafer (MST1) or selectively at different locations on the water (MST2) with an optional CMP). The silicide module 296 further illustratively includes silicide block mask patterning which includes lithography, etching, and photoresist (PR) removal, then silicide metal physical vapor deposition (PVD) including a pre-clean and sputter, followed by silicide rapid thermal anneal(s) (RTA), and metal removal via wet etch, for example. It should be noted that certain steps and modules may be performed in different orders in different embodiments, depending upon the type of semiconductor device being created.

Various devices may be created using the above-described structures and processes. One such device is a tunneling-based SRAM (TSRAM) cell. Using the above-described techniques, a smaller than conventional 6T-SRAM cell (~150F$^2$) may be produced having less power consumption than conventional DRAM cells (4~8F$^2$). Applicability to multi-bit cells may be provided by increasing the number of RTDs, for example.

Other logic circuit elements in which the above-described DBRTDs may be implemented include FETs and BJTs. One potential benefit of such configurations may include high-speed operation, as tunneling time scale is within pica seconds. Another potential benefit is relatively low power operation, because transition currents during state change may be limited by valley current. For example, greater than 50% reduction of circuit elements may be realized in some instances for implementing a given function, and the I-V curve of NDR devices intersects with other device's load line (at least) twice.

As noted above, another advantageous application for the DBRTDs described herein is a MOBILE logic element. The RTD not only compacts the memory and logic circuitry, but it may also add new functionality. Moreover, integration of the DBRTD structures into standard Si CMOS may help change future circuit design from a system level. For example, this may enable "neuron network" logic replacing conventional Boolean logic. Moreover, this may allow for an immediate impact by hybrid integration with conventional logic (pipelined ripple carry adder, as an example).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   at least one double-barrier resonant tunneling diode (DBRTD) comprising
      a first doped semiconductor layer,
      a first barrier layer on the first doped semiconductor layer and comprising a first superlattice, the first superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions,
      a first intrinsic semiconductor layer on the first barrier layer,
      a second barrier layer on the first intrinsic semiconductor layer and comprising a second superlattice, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions,
      a second intrinsic semiconductor layer on the second barrier layer,
      a third barrier layer on the second intrinsic semiconductor layer and comprising a third superlattice, the third superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions,
      a third intrinsic semiconductor layer on the third barrier layer,
      a fourth barrier layer on the third intrinsic semiconductor layer, and
      a second doped semiconductor layer on the fourth barrier layer.

2. The semiconductor device of claim 1 wherein the first and second doped semiconductor layers each comprises silicon, and wherein the second intrinsic layer comprises at least one of silicon and germanium.

3. The semiconductor device of claim 1 wherein the fourth barrier layer comprises a fourth superlattice, the fourth superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

4. The semiconductor device of claim 3 wherein the second doped semiconductor layer comprises a single crystal semiconductor layer.

5. The semiconductor device of claim 1 wherein the first and second doped semiconductor layers have a same dopant conductivity type.

6. The semiconductor device of claim 1 wherein the first and second doped semiconductor layers have opposite dopant conductivity types.

7. The semiconductor device of claim 1 wherein the first barrier layer and the first intrinsic semiconductor layer define an electron mean free path control layer.

8. The semiconductor device of claim 1 wherein the third intrinsic semiconductor layer and the fourth barrier layer define an electron mean free path control layer.

9. The semiconductor device of claim 1 wherein the respective at least one non-semiconductor monolayer in each of the first, second and third superlattices comprises oxygen.

10. The semiconductor device of claim 1 wherein the respective semiconductor monolayers in each of the first, second and third superlattices comprise silicon.

11. A semiconductor device comprising:
    at least one double-barrier resonant tunneling diode (DBRTD) comprising
       a first doped semiconductor layer,
       a first barrier layer on the first doped semiconductor layer and comprising a first superlattice, the first superlattice comprising a plurality of stacked groups of layers, each group of layers comprising a plurality of stacked base silicon monolayers defining a base semiconductor portion, and at least one oxygen monolayer constrained within a crystal lattice of adjacent base silicon portions,
       a first intrinsic semiconductor layer on the first barrier layer,
       a second barrier layer on the first intrinsic semiconductor layer and comprising a second superlattice, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, a second intrinsic semiconductor layer on the second barrier layer, a third barrier layer on the second intrinsic semiconductor layer and comprising a third superlattice, the third superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, a third intrinsic semiconductor layer on the third barrier layer, a fourth barrier layer on the third intrinsic semiconductor layer, and a second doped semiconductor layer on the fourth layer, the first and second doped semiconductor layers having a same dopant conductivity type.

12. The semiconductor device of claim 11 wherein the first and second doped semiconductor layers each comprises silicon, and wherein the second intrinsic layer comprises at least one of silicon and germanium.

13. The semiconductor device of claim 11 wherein the fourth barrier layer comprises a fourth superlattice, the fourth superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

14. The semiconductor device of claim 13 wherein the second doped semiconductor layer comprises a single crystal semiconductor layer.

15. The semiconductor device of claim 11 wherein the first barrier layer and the first intrinsic semiconductor layer define a first electron mean free path control layer; and wherein the third intrinsic semiconductor layer and the fourth barrier layer define a second electron mean free path control layer.

16. A semiconductor device comprising:
at least one double-barrier resonant tunneling diode (DBRTD) comprising
a first doped semiconductor layer,
a first barrier layer on the first doped semiconductor layer and comprising a first superlattice, the first superlattice comprising a plurality of stacked groups of layers, each group of layers comprising a plurality of stacked base silicon monolayers defining a base semiconductor portion, and at least one oxygen monolayer constrained within a crystal lattice of adjacent base silicon portions, a first intrinsic semiconductor layer on the first barrier layer, a second barrier layer on the first intrinsic semiconductor layer and comprising a second superlattice, the second superlattice comprising a plurality of stacked groups of layers, each group of layers comprising a plurality of stacked base silicon monolayers defining a base semiconductor portion, and at least one oxygen monolayer constrained within a crystal lattice of adjacent base silicon portions, a second intrinsic semiconductor layer on the second barrier layer, a third barrier layer on the second intrinsic semiconductor layer and comprising a third superlattice, the third superlattice comprising a plurality of stacked groups of layers, each group of layers comprising a plurality of stacked base silicon monolayers defining a base semiconductor portion, and at least one oxygen monolayer constrained within a crystal lattice of adjacent base silicon portions, a third intrinsic semiconductor layer on the third barrier layer, a fourth barrier layer on the third intrinsic semiconductor layer, and a second doped semiconductor layer on the fourth barrier layer, the first and second doped semiconductor layers having opposite dopant conductivity types.

17. The semiconductor device of claim 16 wherein the first and second doped semiconductor layers each comprises silicon, and wherein the second intrinsic layer comprises at least one of silicon and germanium.

18. The semiconductor device of claim 16 wherein the fourth barrier layer comprises a fourth superlattice, the fourth superlattice comprising a plurality of stacked groups of layers, each group of layers comprising a plurality of stacked base silicon monolayers defining a base semiconductor portion, and at least one oxygen monolayer constrained within a crystal lattice of adjacent base silicon portions.

19. The semiconductor device of claim 18 wherein the second doped semiconductor layer comprises a single crystal semiconductor layer.

20. The semiconductor device of claim 16 wherein the first barrier layer and the first intrinsic semiconductor layer define a first electron mean free path control layer; and wherein the third intrinsic semiconductor layer and the fourth barrier layer define a second electron mean free path control layer.

* * * * *